United States Patent
Oh et al.

(10) Patent No.: US 9,525,545 B2
(45) Date of Patent: Dec. 20, 2016

(54) PHASE LOCKED LOOP FOR PREVENTING HARMONIC LOCK, METHOD OF OPERATING THE SAME, AND DEVICES INCLUDING THE SAME

(71) Applicant: Samsung Electronics Co., Ltd., Suwon-si (KR)

(72) Inventors: Woon Taek Oh, Seongnam-si (KR); Jin Ho Kim, Suwon-si (KR); Tae Jin Kim, Seoul (KR); Jae Youl Lee, Hwaseong-si (KR); Young Hwan Chang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 189 days.

(21) Appl. No.: 14/182,029

(22) Filed: Feb. 17, 2014

(65) Prior Publication Data

US 2014/0240371 A1  Aug. 28, 2014

(30) Foreign Application Priority Data

Feb. 25, 2013  (KR) ........................ 10-2013-0019925

(51) Int. Cl.
| | | |
|---|---|---|
| H03L 7/06 | (2006.01) | |
| H04L 7/033 | (2006.01) | |
| G09G 5/02 | (2006.01) | |
| G11C 7/10 | (2006.01) | |
| G09G 3/20 | (2006.01) | |
| H03L 7/095 | (2006.01) | |
| G11C 7/22 | (2006.01) | |

(52) U.S. Cl.
CPC ............... *H04L 7/0331* (2013.01); *G09G 3/20* (2013.01); *G09G 5/02* (2013.01); *G11C 7/1096* (2013.01); *H03L 7/095* (2013.01); *H04L 7/033* (2013.01); *G09G 2310/027* (2013.01); *G09G 2310/0267* (2013.01); *G11C 7/222* (2013.01)

(58) Field of Classification Search
USPC ................................. 327/147–149, 156–158
See application file for complete search history.

(56) References Cited

U.S. PATENT DOCUMENTS

| | | | |
|---|---|---|---|
| 5,337,022 A * | 8/1994 | Pritchett | ................ H03L 7/095 331/1 A |
| 6,876,240 B2 | 4/2005 | Moon et al. | |
| 7,126,432 B2 | 10/2006 | Roubadia et al. | |
| 7,233,182 B1 * | 6/2007 | Savoj | .................... H03L 7/0812 327/141 |
| 7,786,763 B1 | 8/2010 | Bal et al. | |
| 7,830,212 B2 | 11/2010 | Lee et al. | |

(Continued)

FOREIGN PATENT DOCUMENTS

| | | |
|---|---|---|
| JP | 2007-116662 | 5/2007 |
| JP | 2010130594 A | 6/2010 |

(Continued)

*Primary Examiner* — Adam Houston
(74) *Attorney, Agent, or Firm* — Myers Bigel, P.A.

(57) ABSTRACT

A phase locked loop includes a voltage controlled oscillator including a plurality of delay cells configured to respectively generate a plurality of clock signals having different phases and a harmonic lock detector configured to detect harmonic lock in the voltage controlled oscillator and to generate a reset signal in response. Remaining ones of the delay cells other than a first delay cell among the plurality of delay cells are reset in response to the reset signal.

8 Claims, 10 Drawing Sheets

(56) References Cited

U.S. PATENT DOCUMENTS

| | | | | |
|---|---|---|---|---|
| 2006/0132205 A1* | 6/2006 | Wu | ............... | H03L 7/0812 |
| | | | | 327/158 |
| 2007/0210842 A1* | 9/2007 | Kawamoto | ......... | H03L 7/0812 |
| | | | | 327/158 |
| 2007/0213019 A1 | 9/2007 | Devries et al. | | |
| 2009/0167387 A1* | 7/2009 | Kim | ............... | H03L 7/0812 |
| | | | | 327/157 |
| 2012/0306551 A1* | 12/2012 | Moon | ............... | H03L 7/0814 |
| | | | | 327/149 |
| 2014/0118040 A1* | 5/2014 | Nakayama | ......... | H03L 7/0816 |
| | | | | 327/157 |
| 2014/0240371 A1* | 8/2014 | Oh | ............... | G09G 5/02 |
| | | | | 345/690 |

FOREIGN PATENT DOCUMENTS

| | | |
|---|---|---|
| KR | 1020060077172 A | 7/2006 |
| KR | 1020100010992 A | 2/2010 |
| KR | 1020100033411 A | 3/2010 |
| KR | 1020110067726 A | 6/2011 |

* cited by examiner

PHASE LOCKED LOOP FOR PREVENTING HARMONIC LOCK, METHOD OF OPERATING THE SAME, AND DEVICES INCLUDING THE SAME

CROSS-REFERENCE TO RELATED APPLICATION

This application claims priority under 35 U.S.C. §119(a) from Korean Patent Application No. 10-2013-0019925 filed on Feb. 25, 2013, the disclosure of which is hereby incorporated by reference in its entirety.

FIELD

Embodiments of the inventive concept relate to a phase locked loop (PLL), and more particularly, to a PLL including delay cells connected in series in a voltage controlled oscillator (VCO), methods of operating the same, and devices including the same.

BACKGROUND

The data processing speed of digital systems is rapidly increasing. In order to process data at high speed, digital systems require high-speed clock signals. A phase locked loop (PLL) generates and provides high-speed clock signals for digital systems.

The clock signals generated by a PLL have a limited frequency. To overcome this limit, the number of delay cells included in a voltage controlled oscillator (VCO) of the PLL may be increased. However, when the number of delay cells is increased, harmonic lock may occur in the PLL, which can prevent the PLL from functioning properly.

SUMMARY

According to some embodiments of the inventive concept, there is provided a phase locked loop including a voltage controlled oscillator including a plurality of delay cells configured to respectively generate a plurality of clock signals respectively having different phases and a harmonic lock detector configured to detect harmonic lock in the voltage controlled oscillator and to generate a reset signal in response to detecting harmonic lock. Remaining ones of the delay cells other than a first delay cell of the plurality of delay cells are reset in response to the reset signal.

The harmonic lock detector may generate the reset signal using some of the plurality of clock signals.

The remaining delay cells each may include a unit delay cell, a bias current generator, and a reset switch configured to control connection between the bias current generator and an operating voltage supply terminal of the unit delay cell in response to the reset signal.

Alternatively, the remaining delay cells may each include a unit delay cell, a bias current generator connected to a ground voltage supply terminal of the unit delay cell, and a reset switch configured to control connection between the bias current generator and a ground in response to the reset signal.

When the reset signal is deactivated, a current delay cell among the remaining delay cells may generate a realigned clock signal based on a clock signal output from a previous delay cell.

According to other embodiments of the inventive concept, there is provided a display device including the above-described phase locked loop and a recovery circuit configured to sample a serial data stream received from an external device in response to an output signal of the phase locked loop and to recover RGB data from sampled data.

According to further embodiments of the inventive concept, there is provided a radio communication device including the above-described phase locked loop, a transmitter configured to perform a transmitting operation in response to an output signal of the phase locked loop, a receiver configured to perform a receiving operation in response to the output signal of the phase locked loop, and a processor configured to control the operation of the transmitter and the operation of the receiver.

According to other embodiments of the inventive concept, there is provided a semiconductor device including the above-described phase locked loop, a memory array including a plurality of memory cells, and an input/output circuit configured to control a write operation and a read operation of the memory cell array in response to an output signal of the phase locked loop.

According to yet other embodiments of the inventive concept, there is provided a method of operating a phase locked loop. The method includes detecting harmonic lock and generating a reset signal; and resetting remaining delay cells excluding some delay cells among a plurality of delay cells connected in series in response to the reset signal.

DETAILED DESCRIPTION OF THE EMBODIMENTS

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
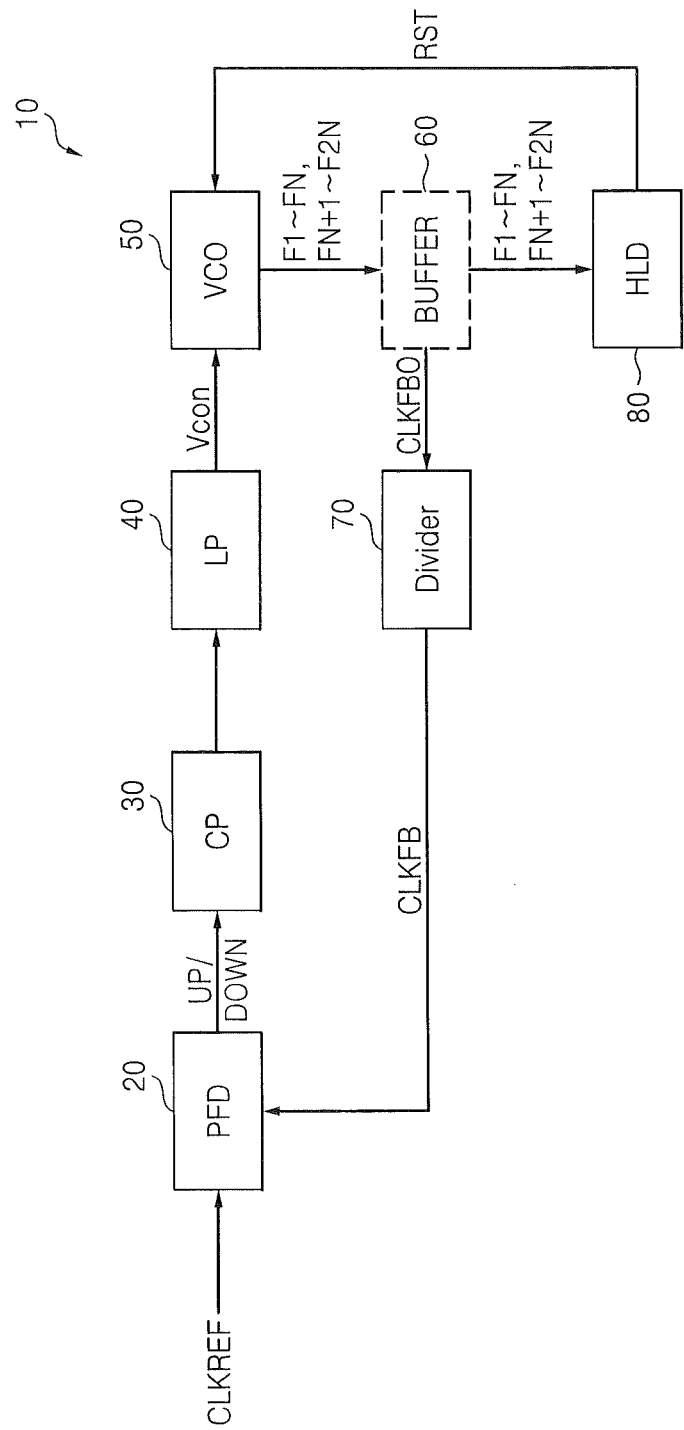
FIG. 1 is a block diagram of a phase locked loop (PLL) according to some embodiments of the inventive concept.

FIG. 1 is a block diagram of a phase locked loop (PLL) 10 according to some embodiments of the inventive concept. Referring to FIG. 1, the PLL 10 may include a phase frequency detector (PFD) 20, a charge pump (CP) 30, a loop filter (LP) 40, a voltage controlled oscillator (VCO) 50, a divider 70, and a harmonic lock detector (HLD) 80. The PLL 10 may also include a buffer 60.

The PLL 10 may detect a difference between the phase of a reference clock signal CLKREF and the phase of a feedback clock signal CLKFB, and may generate a plurality of clock signals F1 through FN and FN+1 through F2N (i.e., F1 through F2N) having different phases from one another according to the detection result. The clock signals F1 through F2N may be called multi-phase clock signals. The PLL 10 may also detect harmonic lock and reset the VCO 50 that generates the multi-phase clock signals F1 through F2N if harmonic lock is detected.

The phase frequency detector 20 may detect the difference between the phase of the reference clock signal CLKREF and the phase of the feedback clock signal CLKFB, and generate a phase detection signal UP or DOWN corresponding to the detected difference. For instance, when the phase of the feedback clock signal CLKFB lags behind the phase of the reference clock signal CLKREF, the phase frequency detector 20 may output the first phase detection signal UP. However, when the phase of the feedback clock signal CLKFB leads the phase of the reference clock signal CLKREF, the phase frequency detector 20 may output the second phase detection signal DOWN. In other embodiments, the first phase detection signal UP and the second phase detection signal DOWN may be generated under conditions opposite to the above-described ones.

The charge pump 30 may source current that is output from a power supply to an output terminal, or sink current from the output terminal to a ground, in response to the phase detection signal UP or DOWN. For instance, the charge pump 30 may source the current from the power supply to the loop filter 40 when the phase frequency detector 20 outputs the first phase detection signal UP and may sink current from the loop filter 40 to the ground when the phase frequency detector 20 outputs the second phase detection signal DOWN.

The loop filter 40 may increase an output voltage Vcon according to the sourced current or decrease the output voltage Vcon according to the sunk current. In other words, the loop filter 40 may generate an output voltage Vcon that varies with the sourced or sunk current. The output voltage Vcon may be used as a control voltage that controls the frequency of the VCO 50. In addition, the loop filter 40 may reduce and/or eliminate glitches from the current output from the charge pump 30 and reduce or prevent voltage overshoot, thereby reducing or eliminating jitter in the signals output by the VCO 50.

The charge pump 30 and the loop filter 40 may be implemented together in a single circuit. The combined circuit may output the variable output voltage Vcon in response to the phase detection signal UP or DOWN.

If the buffer 60 is not included in the PLL 10, the VCO 50 may output the multi-phase clock signals F1 through F2N to the harmonic lock detector 80 in response to the output voltage Vcon of the loop filter 40. The VCO 50 may, for example, be implemented by a ring oscillator.

When the phase frequency detector 20 outputs the first phase detection signal UP, the VCO 50 may increase the frequency of the multi-phase clock signals F1 through F2N. When the phase frequency detector 20 outputs the second phase detection signal DOWN, the VCO 50 may decrease the frequency of the multi-phase clock signals F1 through F2N. At this time, the multi-phase clock signals F1 through F2N may have the same amplitude.

The VCO 50 may output one of the multi-phase clock signals F1 through F2N to the divider 70 as a phase clock signal CLKFB0. The VCO 50 may also reset delay cells excluding some delay cells (e.g., one delay cell) among a plurality of delay cells, which respectively generate the multi-phase clock signals F1 through F2N, in response to a reset signal RST output from the harmonic lock detector 80. For instance, the excluded delay cell may be the first delay cell among the plurality of delay cells. A structure and reset method of the VCO 50 according to some embodiments will be described in detail below with reference to FIGS. 2 and 3.

If the buffer 60 is included in the PLL 10, the buffer 60 may buffer the multi-phase clock signals F1 through F2N output from the VCO 50. The buffer 60 may output one of the buffered multi-phase clock signals F1 through F2N to the divider 70 as the phase clock signal CLKFB0, and may output the buffered multi-phase clock signals F1 through F2N to the harmonic lock detector 80.

The divider 70 may divide the frequency of the phase clock signal CLKFB0 output from the VCO 50 or the buffer 60 by a division factor, and generate the feedback clock signal CLKFB having the divided frequency. The division factor may be an integer (e.g., N) or a real number. The division factor may be programmed into the divider 70.

The harmonic lock detector 80 may detect harmonic lock based on the multi-phase clock signals F1 through F2N, generate the reset signal RST according to the detection result, and output the reset signal RST to the VCO 50. The harmonic lock detector 80 may generate the reset signal RST using some of the multi-phase clock signals F1 through F2N output from the VCO 50 or the buffer 60. A method of detecting the harmonic lock and generating the reset signal RST using the harmonic lock detector 80 will be described in detail below with reference to FIG. 4.

Figure 2:
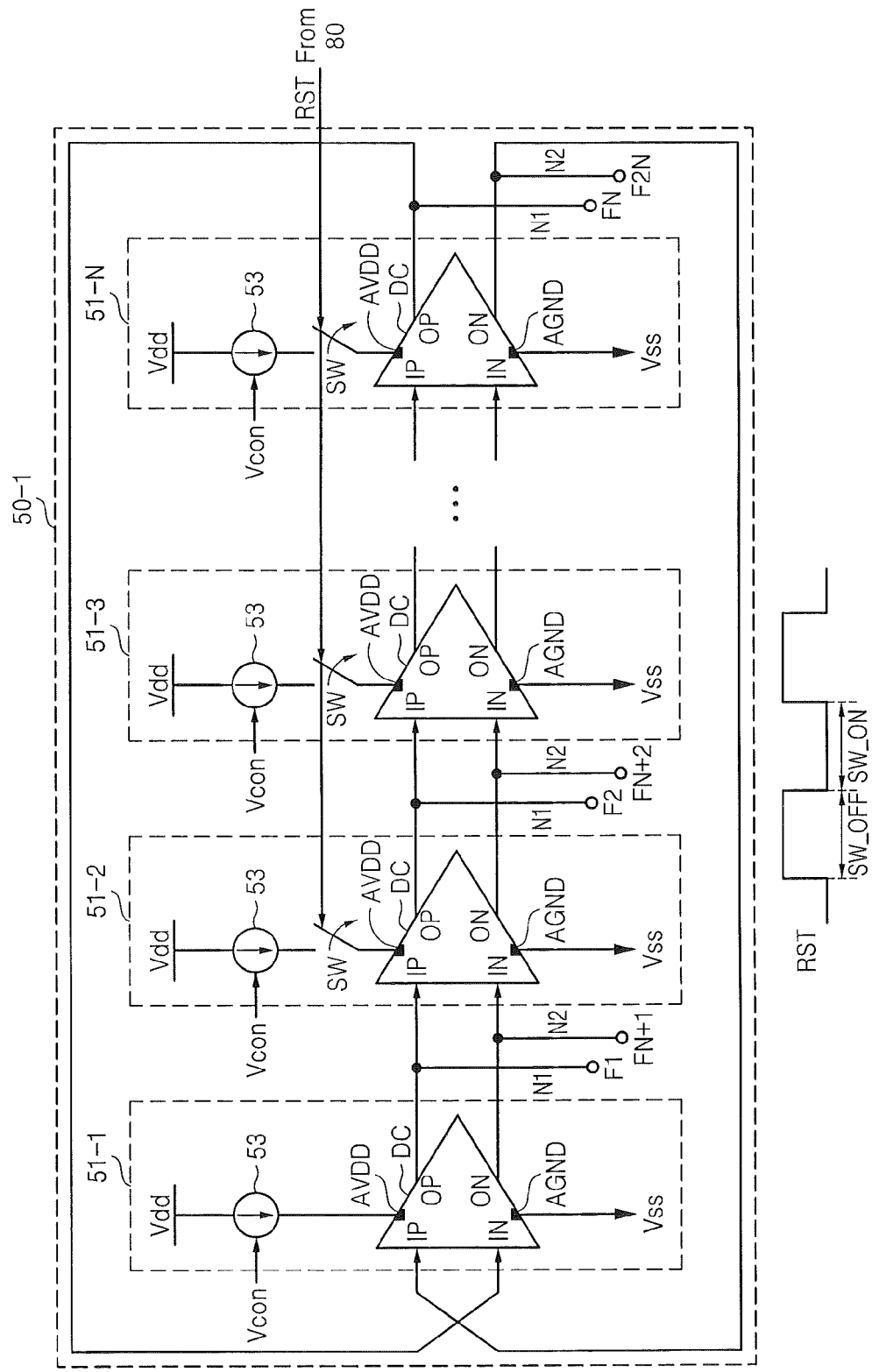
FIG. 2 is a block diagram of a voltage controlled oscillator (VCO) according to some embodiments of the inventive concept.

FIG. 2 is a block diagram of a VCO 50-1 according to some embodiments of the inventive concept. Referring to FIGS. 1 and 2, the VCO 50-1 may include a plurality of delay cells 51-1 through 51-N connected in series. The VCO 50-1 illustrated in FIG. 2 is an example of the VCO 50 illustrated in FIG. 1.

The VCO 50-1 may output the multi-phase clock signals F1 through F2N to the harmonic lock detector 80 directly or through the buffer 60 according to the output voltage Vcon output from the loop filter 40.

The VCO 50-1 may also reset the delay cells 51-2 through 51-N of the VCO 50-1 in response to the reset signal RST output from the harmonic lock detector 80. That is, the VCO 50-1 may reset all of the delay cells 51-1 through 51-N, which generate the multi-phase clock signals F1 through F2N, except, for example, the first delay cell 51-1 which generates the multi-phase clock signals F1 and FN+1.

The delay cells 51-1 through 51-N may generate the multi-phase clock signals F1 through F2N based on the output voltage Vcon output from the loop filter 40. Accordingly, the VCO 50-1 may output the multi-phase clock signals F1 through F2N generated from the delay cells 51-1 through 51-N to the harmonic lock detector 80 directly or through the buffer 60. The delay cells 51-2 through 51-N (excluding the first delay cell 51-1) may be reset in response to the reset signal RST that has been activated. That is, the remaining cells 51-2 through 51-N may be initialized in response to the reset signal RST that has been activated.

Figure 3:
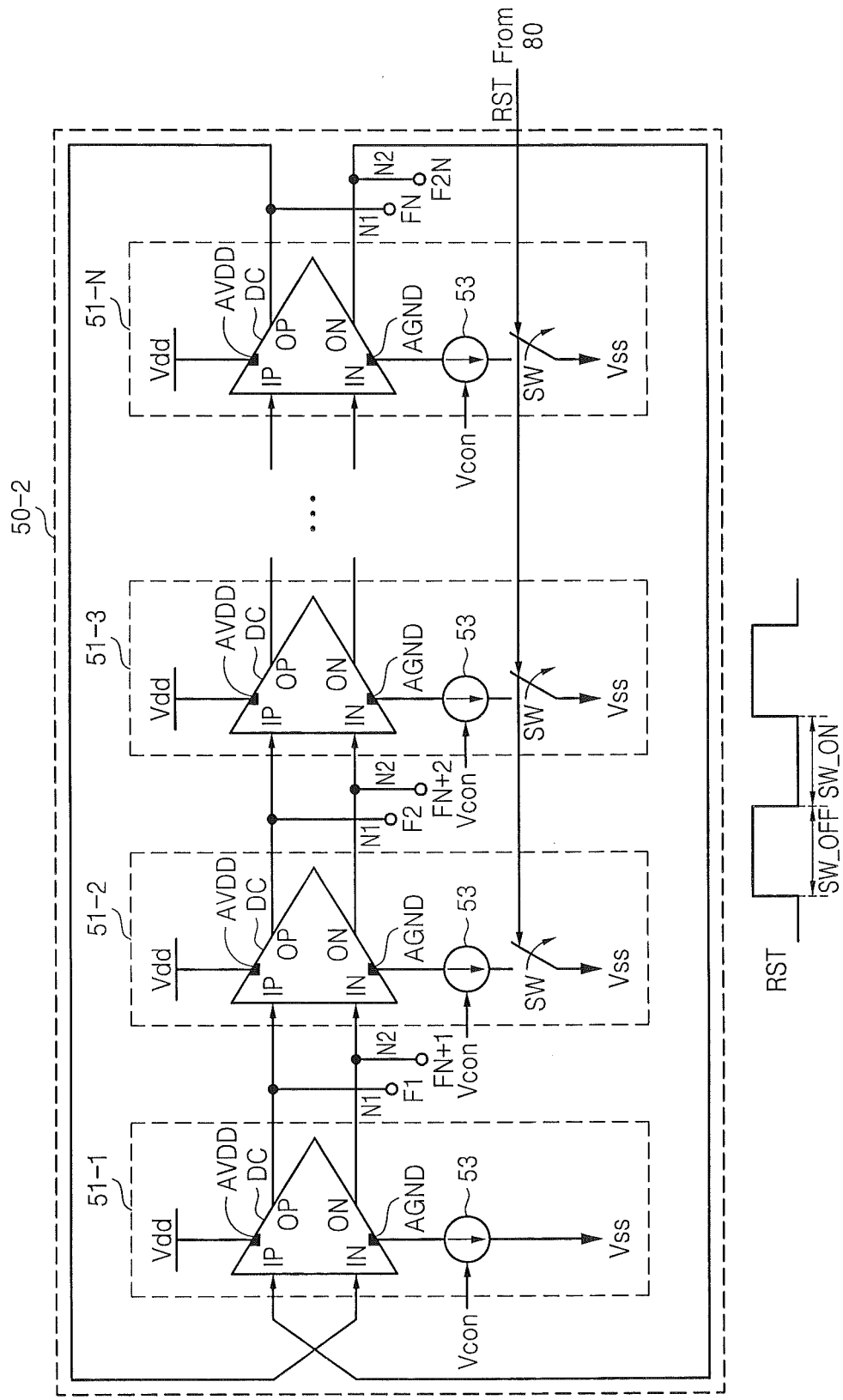
FIG. 3 is a block diagram of a VCO according to other embodiments of the inventive concept.

In the embodiments illustrated in FIGS. 2 and 3, the one delay cell that is excluded is the first delay cell 51-1, but any one of the delay cells 51-1 through 51-N may be excluded from being reset in response to the reset signal. Each of the delay cells 51-1 through 51-N may include a bias current generator 53 and a unit delay cell DC. Each of the remaining cells 51-2 through 51-N excluding the first delay cell 51-1 may also include a reset switch SW.

The reset switch SW may be switched off (SW_OFF) in response to the reset signal RST being activated, and may be switched on (SW_ON) in response to the reset signal RST being deactivated. The bias current generator 53 may generate a bias current based on the output voltage Vcon of the loop filter 40.

The unit delay cell DC may include input terminals IP and IN, output terminals OP and ON, an operating voltage supply terminal AVDD, and a ground voltage supply terminal AGND. The unit delay cell DC may be implemented, for example, by an inverter or a differential delay cell.

A plurality of unit delay cells DC may be connected in series. In particular, the output terminals OP and ON of a current unit delay cell DC may be respectively connected with the input terminals IP and IN of a subsequent unit delay cell DC. However, the input terminals IP and IN of the first unit delay cell DC may be respectively connected with the output terminals ON and OP of the last unit delay cell DC. At least one unit delay cell DC may be connected in series between the first unit delay cell DC and the last unit delay cell DC.

The operating voltage supply terminal AVDD of each unit delay cell DC may receive the bias current generated by the bias current generator 53. The ground voltage supply terminal AGND of each unit delay cell DC may be connected to a ground Vss.

The first unit delay cell DC may receive the multi-phase clock signal FN or F2N output from the last unit delay cell DC through the input terminal IP or IN. The first unit delay cell DC may generate the multi-phase clock signal F1 or FN+1 based on the multi-phase clock signal FN or F2N received from the last unit delay cell DC according to the bias current generated from the bias current generator 53 and may output the multi-phase clock signal F1 or FN+1 through the output terminal OP or ON.

The multi-phase clock signal F1 or FN+1 generated from the first unit delay cell DC is input to the input terminal IP or IN of the second unit delay cell DC and may be output through a node N1 or N2. The unit delay cells DC have substantially the same structure and perform substantially the same operation as one another.

The reset switch SW may control the connection between the bias current generator 53 and the operating voltage supply terminal AVDD of a unit delay cell DC in response to the reset signal RST output from the harmonic lock detector 80.

When the reset signal RST is activated, the reset switch SW may be turned off. For instance, when the reset switch SW is turned off in response to the reset signal RST that has been activated, the bias current generated from the bias current generator 53 is not transmitted to the operating voltage supply terminal AVDD of the unit delay cell DC in each of the delay cells 51-2 through 51-N. In other words, the delay cells 51-2 through 51-N may be reset or initialized. The first delay cell 51-1 may always be maintained in an on state regardless of the reset signal RST output from the harmonic lock detector 80.

The reset switch SW is connected not to the output terminal of the delay cells 51-2 through 51-N but to the operating voltage supply terminal AVDD, and therefore, the load of the unit delay cell DC may be reduced and the power consumption of the unit delay cell DC may also be reduced. As a result, the overall power consumption of the PLL 10 may be reduced. In addition, since not all of the delay cells 51-1 through 51-N in the VCO 50 are reset, the operating area of the VCO 50 may not be decreased.

When the reset signal RST is deactivated, the reset switch SW may be turned on. For instance, when the reset switch SW is turned on in response to deactivation of the reset signal RST, the delay cells 51-2 through 51-N may generate a realigned multi-phase clock signal based on the clock signal F1 or FN+1 output from the first delay cell 51-1. Accordingly, the PLL 10 may be less susceptible to the occurrence of harmonic lock.

FIG. 3 is a block diagram of a VCO 50-2 according to other embodiments of the inventive concept. Referring to FIGS. 1 and 3, the VCO 50-2 may include a plurality of the delay cells 51-1 through 51-N. The VCO 50-2 illustrated in FIG. 3 is another example of the VCO 50 illustrated in FIG. 1.

The operating voltage supply terminal AVDD of each unit delay cell DC directly receives an operating voltage Vdd. The operating voltage supply terminal AVDD of the unit delay cell DC is connected to the bias current generator 53.

The reset switch SW may control the connection between the bias current generator 53 and the ground Vss in response to the reset signal RST output from the harmonic lock detector 80. When the reset signal RST is activated, the reset switch SW may be turned off. When the reset signal RST is deactivated, the reset switch SW may be turned on.

Figure 4:
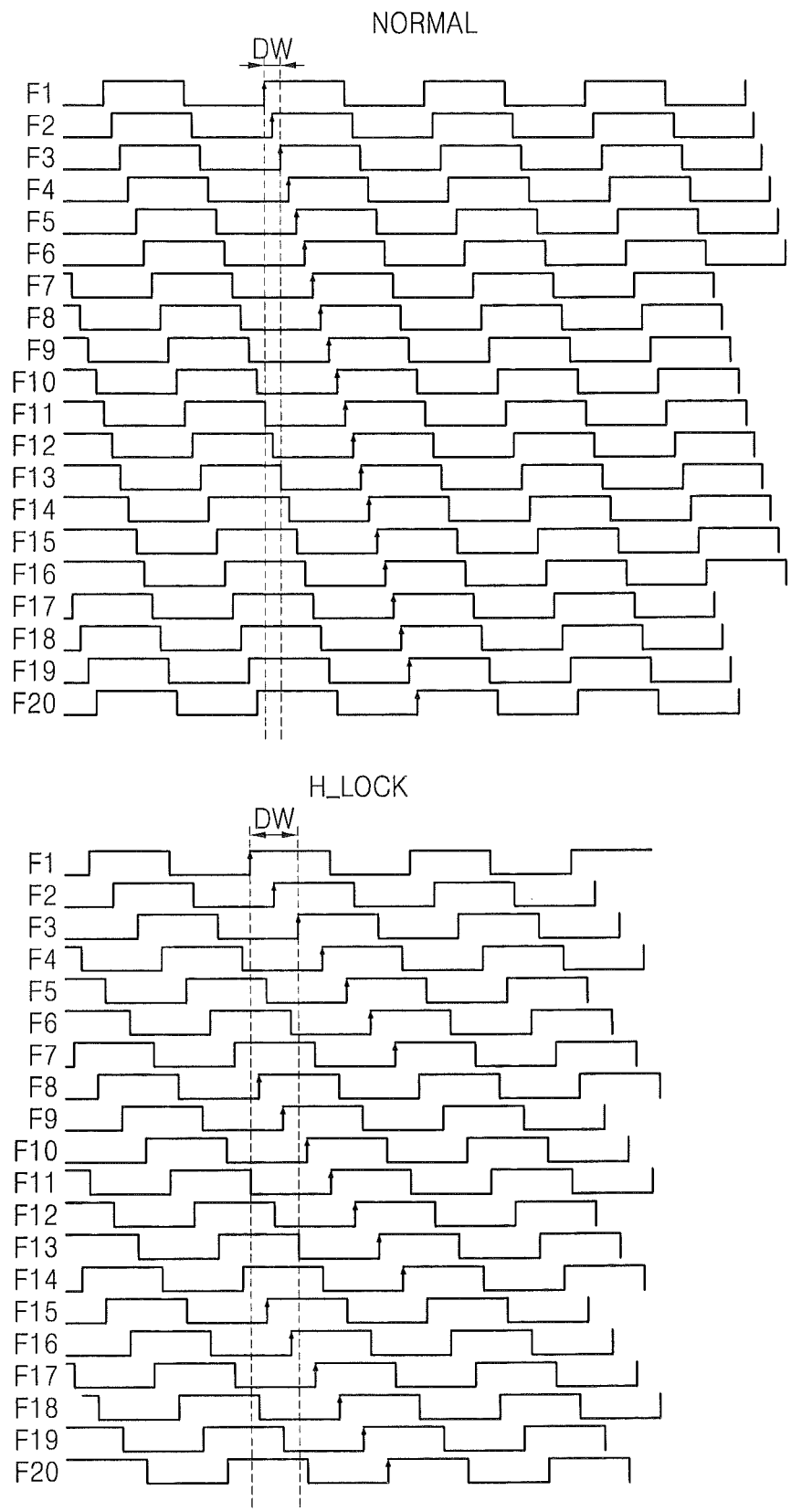
FIG. 4 is a diagram for explaining a method of detecting harmonic lock using a harmonic lock detector illustrated in FIG. 1.

FIG. 4 is a diagram that illustrates methods of detecting harmonic lock using the harmonic lock detector 80 illustrated in FIG. 1. Referring to FIGS. 2 through 4, it is assumed that the VCO 50 includes 10 delay cells and generates multi-phase clock signals F1 through F20. In other words, the VCO 50 may generate the multi-phase clock signals F1 through F20 respectively having different phases in response to the output voltage Vcon output from the loop filter 40.

Referring to FIGS. 1 and 4, the harmonic lock detector 80 may detect harmonic lock and generate the reset signal RST. In detail, the harmonic lock detector 80 may receive the multi-phase clock signals F1 through F20 from the VCO 50 or the buffer 60 and generate the reset signal RST using some of the multi-phase clock signals F1 through F20.

The harmonic lock detector 80 may set a detection window DW using at least two multi-phase clock signals F1 and F3 among the multi-phase clock signals F1 through F20, determines the logic state of at least one of the multi-phase clock signals F1 through F20 using the detection window DW, and generate the reset signal RST based on the determination result.

In particular embodiments, the harmonic lock detector 80 may set the detection window DW using the first multi-phase clock signal F1 and the third multi-phase clock signal F3. When the PLL 10 is in a normal operation NORMAL, the logic state of the seventh multi-phase clock signal F7 may be a first level, e.g., a low level, in the detection window DW and the logic state of the seventeenth multi-phase clock signal F17 may be a second level, e.g., a high level, in the detection window DW. However, when the PLL 10 is in a state of harmonic lock H_LOCK, the logic state of the seventh multi-phase clock signal F7 may be a high level and the logic state of the seventeenth multi-phase clock signal F17 may be a low level in the detection window DW.

In other words, when the PLL 10 changes from normal operation to a state of harmonic lock (H_LOCK), the multi-phase clock signals F1 through F20 may not be output sequentially, and therefore, the logic state of the seventh and seventeenth multi-phase clock signals F7 and F17 may change in the detection window DW. In other words, the harmonic lock detector 80 may receive the multi-phase clock signals F1 through F20 from the VCO 50 or the buffer 60 and detect the harmonic lock H_LOCK using some of the multi-phase clock signals F1 through F20.

The at least two multi-phase clock signals F1 and F3 used to set the detection window DW and the at least one multi-phase clock signal F7 or F17 of which the logic state is detected are not restricted to the embodiments illustrated in FIG. 4. Any other multi-phase clock signals may be used for the same purpose and may be changed depending on the number of delay cells included in the VCO 50.

Figure 5:
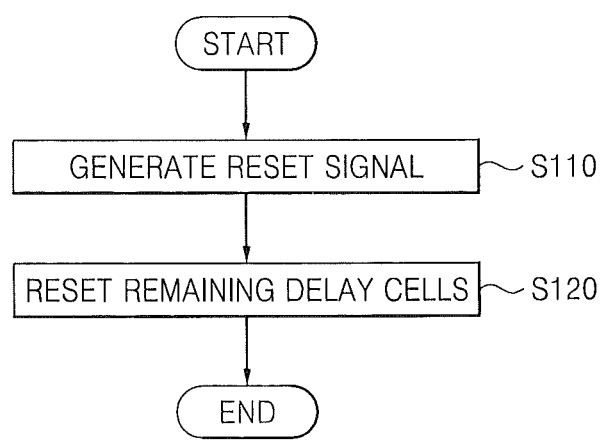
FIG. 5 is a flowchart of a method of operating a PLL according to some embodiments of the inventive concept.

FIG. 5 is a flowchart that illustrates methods of operating the PLL 10 according to some embodiments of the inventive concept. Referring to FIGS. 1 through 5, the harmonic lock detector 80 may detect the harmonic lock H_LOCK and generate the reset signal RST in operation S110. At this time, the harmonic lock detector 80 may generate the reset signal RST using some of the multi-phase clock signals F1 through F2N.

A subset of the delay cells 51-1 to 51-N, for example, the delay cells 51-2 through 51-N and excluding, for example, the delay cell 51-1, may be reset in response to the reset signal RST in operation S120. When the reset signal RST is deactivated, the remaining delay cells 51-2 through 51-N may generate a realigned multi-phase clock signal based on the multi-phase clock signal F1 or FN+1 output from the excluded delay cell 51-1.

Figure 6:
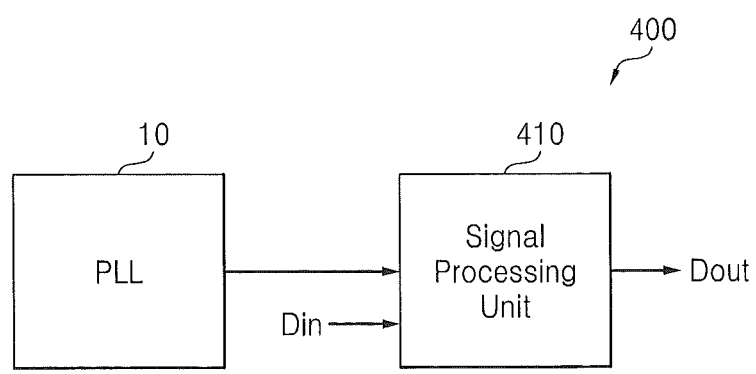
FIG. 6 is a diagram of a signal processing device including the PLL illustrated in FIG. 1.

FIG. 6 is a diagram of a signal processing device 400 including the PLL 10 illustrated in FIG. 1. Referring to FIG. 6, the signal processing device 400 may include the PLL 10 and a signal processing unit 410.

The signal processing unit 410 may process an input signal Din in response to an output signal of the PLL 10 and may output an output signal Dout according to the processing result. The signal processing unit 410 may be implemented as an analog circuit or a digital circuit. Accordingly, the signal processing unit 410 may be implemented by a processor, a central processing unit (CPU), a transceiver circuit, or a communication circuit.

The signal processing device 400 may be implemented as a personal computer (PC) or a portable electronic device. The portable device may be implemented as a handheld device such as a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

Figure 7:
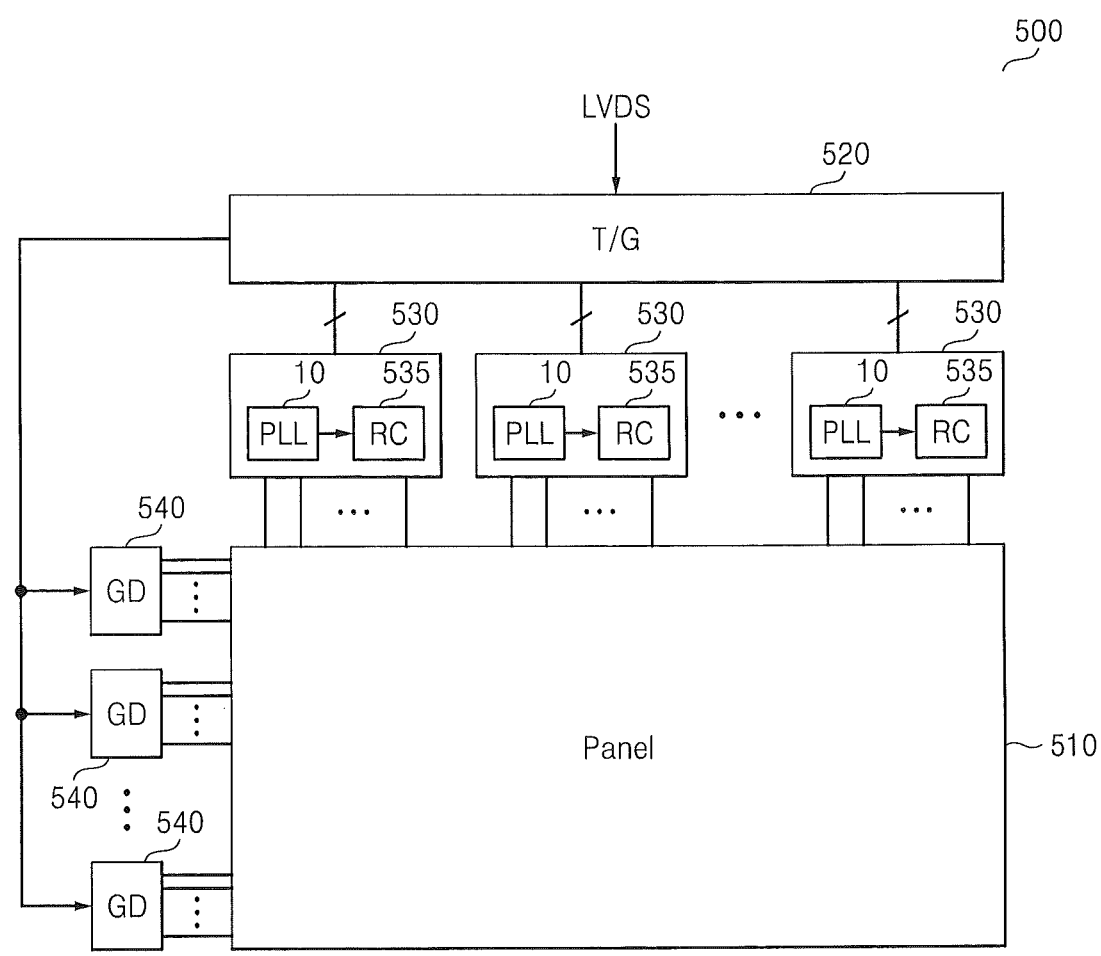
FIG. 7 is a diagram of a display device including the PLL illustrated in FIG. 1.

FIG. 7 is a diagram of a display device 500 including the PLL 10 illustrated in FIG. 1. Referring to FIG. 7, the display device 500 may include a display driving circuit and a display panel 510. The display panel 510 may display images according to driving signals, such as a clock signal, a plurality of control signals, and data signals, output from the display driving circuit.

The display driving circuit or display driver integrated circuit (IC) (DDI) is a device that provides data signals and driving signals for the display panel 510 to display images. It may include a timing controller (T/G) 520, at least one source driver IC 530, and at least one gate driver IC 540. The number of chips, e.g., the source driver IC 530 and the gate driver IC 540, included in the display driving circuit may vary with the size of the display panel 510 or the number of colors to be displayed.

The timing controller 520 may convert image signals LVDS received from an external device into data signals, e.g., RGB data or YUV data, and may generate a plurality of control signals (or driving signals) for controlling the operation of the source driver IC 530 and the operation of the gate driver IC 540. In addition, the timing controller 520 may generate a serial data stream including the RGB data or the YUV data for displaying images on the display panel 510 and output the serial data stream to the source driver IC 530 through signal lines.

When the display device 500 illustrated in FIG. 7 is a medium or large size display device, the display device 500 may use interface such as reduced swing differential signaling (RSDS), mini-low voltage differential signaling (LVDS), point-to-point differential signaling (PPDS), advanced intra-panel interface (AiPi), or mobile industry processor interface (MIPI) to transfer data between the timing controller 520 and the source driver IC 530.

The source driver IC 530 may include the PLL 10 and a recovery circuit 535. The source driver IC 530 may receive a serial data stream from an external element, e.g., the timing controller 520, and may recover RGB data or YUV data from the serial data stream.

The recovery circuit 535 may sample the serial data stream received from the timing controller 520 in response to an output signal of the PLL 10 and may recover the RGB or YUV data from the sampled data. The recovery circuit 535 may output the RGB or YUV data to the display panel 510.

The gate driver IC 540 may sequentially drive gate lines implemented in the display panel 510 in response to at least one control signal output from the timing controller 520. Accordingly, the display panel 510 may display an image based on a driving signal output from the gate driver IC 540 and the RGB or YUV data output from the source driver IC 530.

Figure 8:
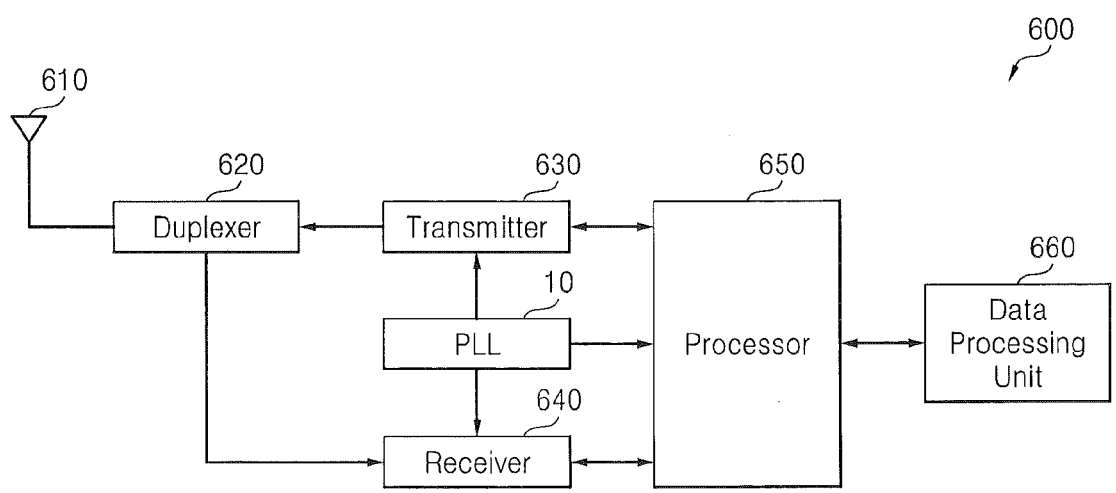
FIG. 8 is a diagram of a radio communication device including the PLL illustrated in FIG. 1.

FIG. 8 is a diagram of a radio communication device 600 including the PLL 10 illustrated in FIG. 1. Referring to FIG. 8, the radio communication device 600 a security system, a set-top box, a mobile communication device, an information technology (IT) device, or a computer system including a radio communication unit. The radio communication device 600 may include an antenna 610, a duplexer 620, a transmitter 630, a receiver 640, the PLL 10, and a processor 650. For convenience' sake in the description, only some of elements of the radio communication device 600 are illustrated in FIG. 6. The radio communication device 600 may include other hardware elements although not shown.

The duplexer 620 may transmit and receive radio frequency (RF) signals through the antenna 610. The transmitter 630 may receive a data signal including real information, such as voice, image, or data, convert the data signal into an RF signal, and output the RF signal. The receiver 640 may receive an RF signal, convert the RF signal into a data signal, and output the data signal. The transmitter 630 or the receiver 640 may operate in response to a signal output from the PLL 10.

The processor 650 may control the operation of the transmitter 630 and the operation of the receiver 640. The processor 650 may operate in response to a signal output from the PLL 10.

The radio communication device 600 may also include a data processing unit 660. The data processing unit 660 may be a display device or an input device. The processor 650 may control the data processing unit 660.

Figure 9:
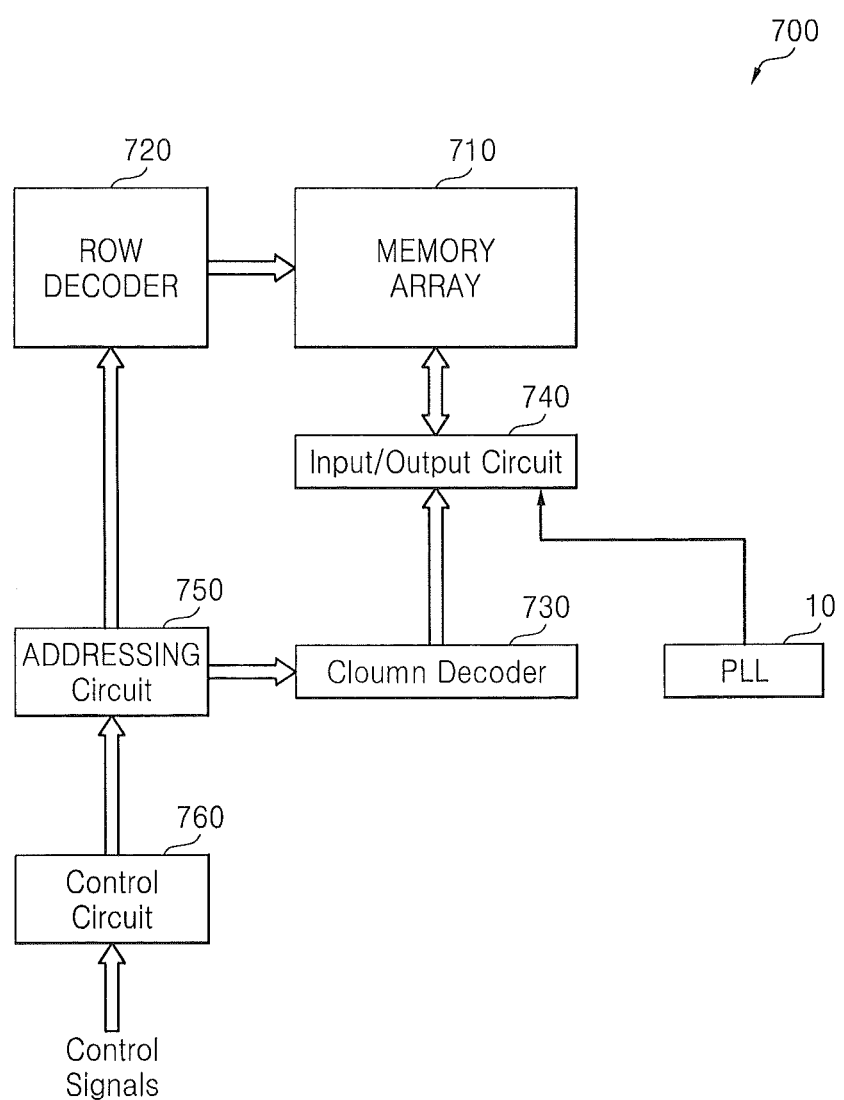
FIG. 9 is a diagram of a semiconductor device including the PLL illustrated in FIG. 1.

FIG. 9 is a diagram of a semiconductor device 700 including the PLL 10 illustrated in FIG. 1. Referring to FIG. 9, the semiconductor device 700 may include the PLL 10, a memory array 710, a row decoder 720, a column decoder 730, an input/output circuit 740, an addressing circuit 750, and a control circuit 760.

The memory array 710 may include a plurality of word lines, a plurality of bit lines, and a plurality of memory cells connected between the word lines and the bit lines.

Each of the memory cells may be implemented by a volatile memory cell such as a dynamic random access memory (DRAM) cell or a static RAM (SRAM) cell or a non-volatile memory cell such as an electrically erasable programmable read-only memory (EEPROM) cell, a flash memory cell, a magnetic random access memory (MRAM) cell, a spin-transfer torque MRAM cell, a conductive bridging RAM (CBRAM) cell, a ferroelectric RAM (FeRAM) cell, a phase-change RAM (PRAM) cell, a resistive RAM (RRAM) cell, a nanotube RRAM cell, a polymer RAM (PoRAM) cell, a nano floating gate memory (NFGM) cell, a holographic memory cell, a molecular electronic memory device cell, or an insulator resistance change memory cell. The non-volatile memory cell may store a bit or a plurality of bits.

The row decoder 720 receives a row address from the addressing circuit 750, decoder the row address, and selects one of the word lines. The column decoder 730 receives a column address from the addressing circuit 750, decodes the column address, and selects one of the bit lines. An output signal of the PLL 10 is transmitted to the input/output circuit 740.

The input/output circuit 740 may write data to at least one memory cell selected by the row decoder 720 and the column decoder 730 in response to the output signal of the PLL 10. The input/output circuit 740 may also read data from at least one memory cell selected by the row decoder 720 and the column decoder 730 in response to the output signal of the PLL 10. The input/output circuit 740 may include a plurality of sense amplifiers that sense and amplify read data in a read operation and a plurality of drivers that drive write data in a write operation.

The addressing circuit 750 may generate the row address and the column address under the control of the control circuit 760. The control circuit 760 generates a plurality of operation control signals for controlling the operation of the addressing circuit 750 in response to a plurality of control signals necessary to perform the read operation or the write operation.

Figure 10:
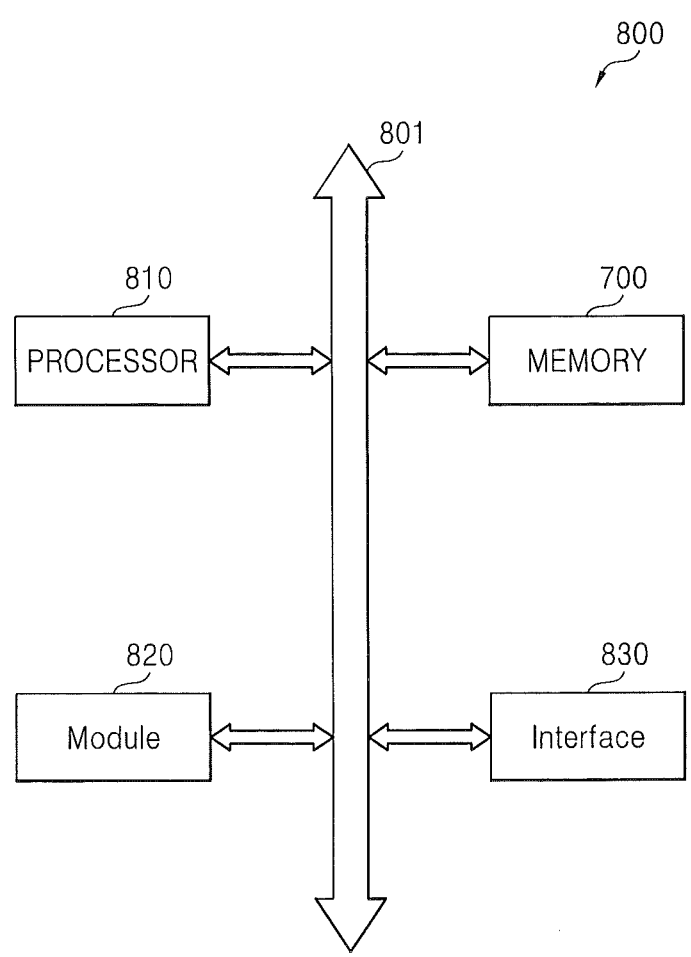
FIG. 10 is a block diagram of a semiconductor system including the semiconductor device illustrated in FIG. 9.

FIG. 10 is a block diagram of a semiconductor system 800 including the semiconductor device 700 illustrated in FIG. 9. Referring to FIG. 10, the semiconductor system 800 may be used in a PC, a portable computer, portable mobile communication equipment, or consumer equipment (CE). The portable mobile communication equipment may be a mobile phone, a PDA, or a PMP. The semiconductor system 800 may be memory card, an e-book, a game console, a game controller, a navigator, or an electronic instrument. The CE may be a digital television (TV), a home automation system, or a digital camera.

The semiconductor system 800 includes the semiconductor device 700 and a processor 810. The semiconductor device 700 and the processor 810 may communicate data with each other through a bus 801. The processor 810 may control the overall memory access operation of the semiconductor device 700.

The semiconductor system 800 may also include a module 820. The module 820 may be a radio communication module. The module 820 may transmit data stored in the semiconductor device 700 to an external device through radio communication and may store data received from the external device in the semiconductor device 700 under the control of the processor 810.

Alternatively, the module 820 may be an image sensor. At this time, the module 820 may store a digital signal generated by picking up an image in the semiconductor device 700 and may transmit data stored in the semiconductor device 700 to an external device through an interface 830 under the control of the processor 810.

The semiconductor system 800 may also include the interface 830. The interface 830 may be a display device, an input device such as a keyboard, a mouse, or a scanner, or an output device such as a printer.

As described above, according to some embodiments of the inventive concept, a PLL resets some delay cells connected in series in a VCO, thereby preventing the decrease of an operation area. In addition, a reset switch for the resetting may be connected not to an output terminal of a unit delay cell but to an operating voltage supply terminal or a ground voltage supply terminal, so that the load of the unit delay cell may be reduced. As a result, the power consumption of the unit delay cell may be decreased, and therefore, the power consumption of the PLL may also be decreased.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A phase locked loop comprising:
 a voltage controlled oscillator comprising a plurality of delay cells configured to respectively generate a plurality of clock signals having respective different phases; and
 a harmonic lock detector configured to detect harmonic lock of the voltage controlled oscillator and to generate a reset signal in response to detecting harmonic lock of the voltage controlled oscillator;
 wherein the plurality of delay cells comprise a first delay cell and a plurality of remaining delay cells; and
 wherein the remaining delay cells are reset in response to the reset signal and the first delay cell is not reset in response to the reset signal.

2. The phase locked loop of claim 1, wherein the harmonic lock detector is configured to generate the reset signal in response to more than one of the plurality of clock signals.

3. The phase locked loop of claim 1, wherein each of the remaining delay cells comprises:
 a unit delay cell;
 a bias current generator coupled to the unit delay cell; and
 a reset switch coupled to the bias current generator.

4. The phase locked loop of claim 3, wherein the reset switch is configured to control connection between the bias current generator and an operating voltage supply terminal of the unit delay cell in response to the reset signal.

5. The phase locked loop of claim 3, wherein the reset switch is configured to control connection between the bias current generator and a ground in response to the reset signal.

6. The phase locked loop of claim 1, wherein when the reset signal is deactivated, at least one of the remaining delay cells generates a realigned clock signal based on a clock signal output from a previous delay cell of the plurality of delay cells.

7. A phase locked loop, comprising:
 a voltage controlled oscillator comprising a plurality of delay cells coupled in series that generate respective clock signals, the plurality of delay cells including a first delay cell and a plurality of remaining delay cells; and
 a harmonic lock detector configured to detect harmonic lock of the voltage controlled oscillator and to reset the remaining delay cells in response to detecting harmonic lock of the voltage controlled oscillator;
 wherein the first delay cell is not reset by the harmonic lock detector in response to detecting harmonic lock of the voltage controlled oscillator.

8. A method of operating a phase locked loop, the method comprising:
 detecting harmonic lock of a voltage controlled oscillator in the phase locked loop;
 generating a reset signal in response to detecting harmonic lock of the voltage controlled oscillator; and
 resetting a plurality of delay cells connected in series in the voltage controlled oscillator other than a first delay cell in the voltage controlled oscillator in response to the reset signal.

* * * * *